(12) United States Patent
Dip et al.

(10) Patent No.: US 7,994,070 B1
(45) Date of Patent: Aug. 9, 2011

(54) LOW-TEMPERATURE DIELECTRIC FILM FORMATION BY CHEMICAL VAPOR DEPOSITION

(75) Inventors: Anthony Dip, Cedar Creek, TX (US); Kimberly G Reid, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/894,513

(22) Filed: Sep. 30, 2010

(51) Int. Cl.
*H01L 21/31* (2006.01)

(52) U.S. Cl. ........ 438/778; 438/784; 438/787; 438/788; 438/791; 257/E21.278

(58) Field of Classification Search .................. 438/778, 438/784, 787, 791
See application file for complete search history.

(56) References Cited

U.S. PATENT DOCUMENTS

| | | | |
|---|---|---|---|
| 6,913,976 B2 | 7/2005 | Lee | |
| 6,936,548 B2 | 8/2005 | Dussarrat | |
| 7,037,785 B2 | 5/2006 | Dong | |
| 7,211,295 B2 * | 5/2007 | Takahashi et al. | 427/255.29 |
| 7,294,582 B2 * | 11/2007 | Haverkort et al. | 438/763 |
| 7,651,730 B2 | 1/2010 | Hasabe | |
| 2002/0182342 A1 * | 12/2002 | Ouellet et al. | 427/569 |
| 2007/0234957 A1 | 10/2007 | Lee | |
| 2009/0278235 A1 | 11/2009 | Mizuno | |

\* cited by examiner

*Primary Examiner* — Hsien-ming Lee

(57) ABSTRACT

A method for depositing a dielectric film on a substrate includes positioning a plurality of substrates in a process chamber, heating the process chamber to a deposition temperature between 400° C. and less than 650° C., flowing a first process gas comprising water vapor into the process chamber, flowing a second process gas comprising dichlorosilane (DCS) into the process chamber, establishing a gas pressure of less than 2 Torr, and reacting the first and second process gases to thermally deposit a silicon oxide film on the plurality of substrates. One embodiment further includes flowing a third process gas comprising nitric oxide (NO) gas into the process chamber while flowing the first process gas and the second process gas; and reacting the oxide film with the third process gas to form a silicon oxynitride film on the substrate.

18 Claims, 5 Drawing Sheets

| Nitric Oxide (sccm) | tox (Å) | dep rate (Å/min) | EOT (Å) | K | Delta Vfb (mV) | Dit (E12 eV⁻¹cm⁻²) |
|---|---|---|---|---|---|---|
| 0 | 45.8 | 4.6 | 33.2 | 5.4 | -15.6 | -1.4 |
| 50 | 51.0 | 5.1 | 35.3 | 5.6 | 23.6 | 1.4 |
| 100 | 55.1 | 5.5 | 36.6 | 5.9 | 31.9 | 1.3 | ns
LOW-TEMPERATURE DIELECTRIC FILM FORMATION BY CHEMICAL VAPOR DEPOSITION

FIELD OF THE INVENTION

The present invention relates to semiconductor substrate processing and, more particularly, to a method for low-temperature dielectric film deposition using a chlorinated silane and water vapor.

BACKGROUND OF THE INVENTION

In the formation of integrated circuits on the surface of a semiconductor substrate, oxide or oxynitride films are frequently grown or deposited over the surface of a crystalline substrate such as silicon. Industry standard processes for chemical vapor deposition (CVD) of high quality silicon oxide ($SiO_x$, $x \leq 2$) films for semiconductor Flash memory and micro-feature sidewall applications are based on high-temperature reactions of dichlorosilane (DCS) and nitrous oxide ($N_2O$), for example. The main benefits of this process include the ability to process multiple substrates simultaneously in a batch process, excellent electrical performance of the silicon oxide films, and relatively low wet etch rates of the films compared to other CVD films, e.g., films deposited using tetraethyl orthosilicate (TEOS), bis(tertiary-butylamino)silane (BTBAS), and other precursors.

However, there are several shortcomings associated with performing CVD of silicon oxide films using DCS and $N_2O$. This CVD process requires relatively high substrate temperature (e.g., around 800° C.) which can limit its use when integrating silicon oxide films with advanced materials that require a low thermal budget. Further, the use $N_2O$ gas as the oxidizing gas has been found to result in poor and generally uncontrollable nitrogen (N) incorporation into the silicon oxide films. Low film deposition rates are thought to be due to a rate limiting DCS nucleation step on the oxide film that is due to absence of gas phase reactions between DCS and $N_2O$.

The demand for high-k dielectrics has required manufacturers to augment existing oxide films (e.g., oxide films on silicon and germanium) by incorporating nitrogen into the oxide films. It is known in the art that nitrogen incorporation into the oxide films increases the dielectric constant of the resulting oxynitride film, and allows thinner gate dielectrics to be grown on these semiconductor substrate materials. Silicon oxynitride ($SiO_xN_y$) films can have good electrical properties, including high electron mobility and low electron trap density that are desirable for device operation in semiconductor applications. Further advantages of nitrogen incorporation in a thin silicon oxide film include: reduced boron penetration through a p-doped polysilicon gate, improved interfacial smoothness, increase in the dielectric constant of the silicon oxynitride film, and improved barrier properties to prevent diffusion of metal oxides or metal gate materials into the underlying substrate.

Due to the miniaturization of semiconductor devices and use of advanced materials that require reduced thermal budgets of semiconductor processing methods, there is a need for new processing methods that provide low temperature silicon oxide and silicon oxynitride films deposition with high nitrogen incorporation at controlled depths while providing a controlled rate of oxide growth.

SUMMARY OF THE INVENTION

One embodiment of the invention provides a method for low-temperature CVD of silicon oxide films on a plurality of substrates in a batch processing system using dichlorosilane (DCS) and water vapor. The method includes positioning a plurality of substrates in a process chamber, heating the process chamber to a deposition temperature between 400° C. and less than 650° C., flowing a first process gas comprising water vapor into the process chamber, flowing a second process gas comprising dichlorosilane (DCS) into the process chamber, establishing a gas pressure of less than 2 Torr in the process chamber, and reacting the first and second process gases to thermally deposit a silicon oxide film on the plurality of substrates. Another embodiment further includes flowing a third process gas comprising nitric oxide (NO) gas into the process chamber while flowing the first process gas and the second process gas; and reacting the oxide film with the third process gas to form a silicon oxynitride film on the substrate.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Embodiments of the invention provide a low-temperature deposition process for forming dielectric films for semiconductor devices. In one embodiment, a method is provided for non-plasma CVD of silicon oxide films using dichlorosilane (DCS) and water vapor. In another embodiment, a method is provided for non-plasma CVD of silicon oxynitride films using DCS, water vapor, and nitric oxide (NO) gas. Embodiments of the invention achieve high deposition rates of silicon dioxide and silicon oxynitride films with good material and electrical properties while utilizing lower deposition temperature than industry standard high-temperature oxide (HTO) processes that rely on the reaction of dichlorosilane (DCS) and nitrous oxide ($N_2O$) on a substrate.

The inventors have realized that replacing a $N_2O$ oxidizer with a water vapor oxidizer, and optionally NO gas for forming silicon oxynitride films, allows for lowering the deposition temperature by greater than 100° C., greater than 200° C., or even greater than 300° C. (e.g., up to 350° C.) while providing silicon oxide films with good material properties that include low wet etch rates that are comparable to baseline HTO processes. This lowering of the deposition temperature provides the required lowering of the thermal budget needed for advanced integrated circuits, since a restricted thermal budget may not allow for increasing the substrate temperature and longer processing times may not be cost effective in high volume manufacturing of semiconductor devices.

The use of water vapor oxidizer provides higher deposition rates than when using $N_2O$ at the same low deposition temperature while providing comparable electrical performance of the silicon oxide and silicon oxynitride films. Unlike HTO processes that utilize $N_2O$, embodiments of the invention provide a mechanism for accurately controlling the N incorporation of the silicon oxynitride films. Further, post-deposition thermal treatments at temperatures greater than the deposition temperature may optionally be performed to further improve the material and electrical properties of the silicon oxide and silicon oxynitride films.

Although not wishing to be bound by theory, the inventors believe that, unlike for the reaction between DCS and $N_2O$ which is thought to occur exclusively on the substrate surface, gas phase reactions between DCS and water vapor, prior to interacting with the substrate surface, enable improved nucleation of the DCS species on the substrate surface due to DCS cracking or formation of a polymer.

Figure 1:
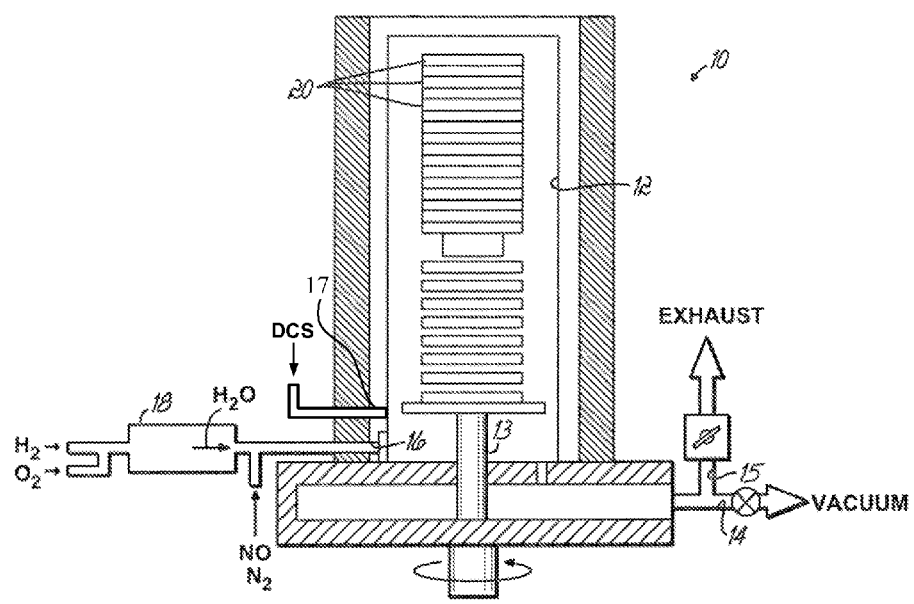
FIG. 1 schematically shows a cross-sectional view of a batch processing system configured to process a plurality of substrates according to an embodiment of the invention.

FIG. 1 shows a cross-sectional view of a batch processing system 10 having a process chamber 12 with a plurality of substrates 20 positioned within the process chamber 12. As one skilled in the art will observe, while a batch processing system 10 is shown and described, the method is also applicable to single substrate processing where the substrates are processed one at a time. FIGS. 2A and 2B depict process flow diagrams for forming silicon oxide and silicon oxynitride films, respectively, on the substrates 20 in FIG. 1.

Figure 2:
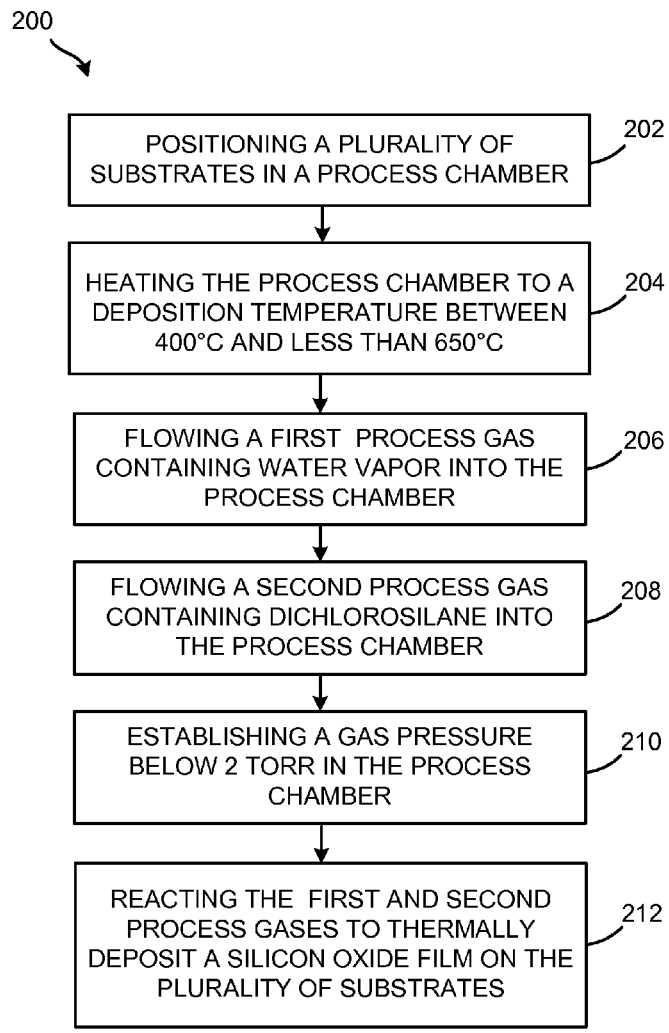
FIG. 2 shows a process flow diagram of one embodiment of the method of depositing an oxide film on a substrate.

Referring now to both FIGS. 1 and 2, in one embodiment of the method 200, in 202, the plurality of substrates 20 are positioned in the process chamber 12. The substrates 20 may be positioned on a rotatable substrate holder 13. As one skilled in the art will observe, positioning or loading the substrates 20 within the batch processing system 10 may include exhausting the process chamber 12 through the exhaust port 15 and evacuating the process chamber 12 through a vacuum port 14 following insertion of the substrates 20. In addition, positioning the substrates 20 within the batch processing system 10 may also include purging the process chamber 12 with inert gas, such as nitrogen, to dilute or reduce the concentration of organic contaminants within the process chamber 12.

In 204, the process chamber 12 is heated to a deposition temperature between 400° C. and less than 650° C. During heating of the process chamber 12, a heating rate may be from a few degrees C. per minute to 100 or more degrees C. per minute.

Following the heating, in 206, a first process gas containing water vapor is introduced into the process chamber 12 through an inlet port 16. The first process gas comprises water vapor but not a nitriding gas. In 208, a second process gas containing DCS and optionally a dilution gas is introduced into the process chamber 12 through an inlet port 17. In 210, a process gas pressure below 2 Torr is established in the process chamber. In 212, oxygen from the water vapor reacts with the DCS in the gas phase and deposits a silicon oxide film onto each of the substrates 20.

Figure 3:
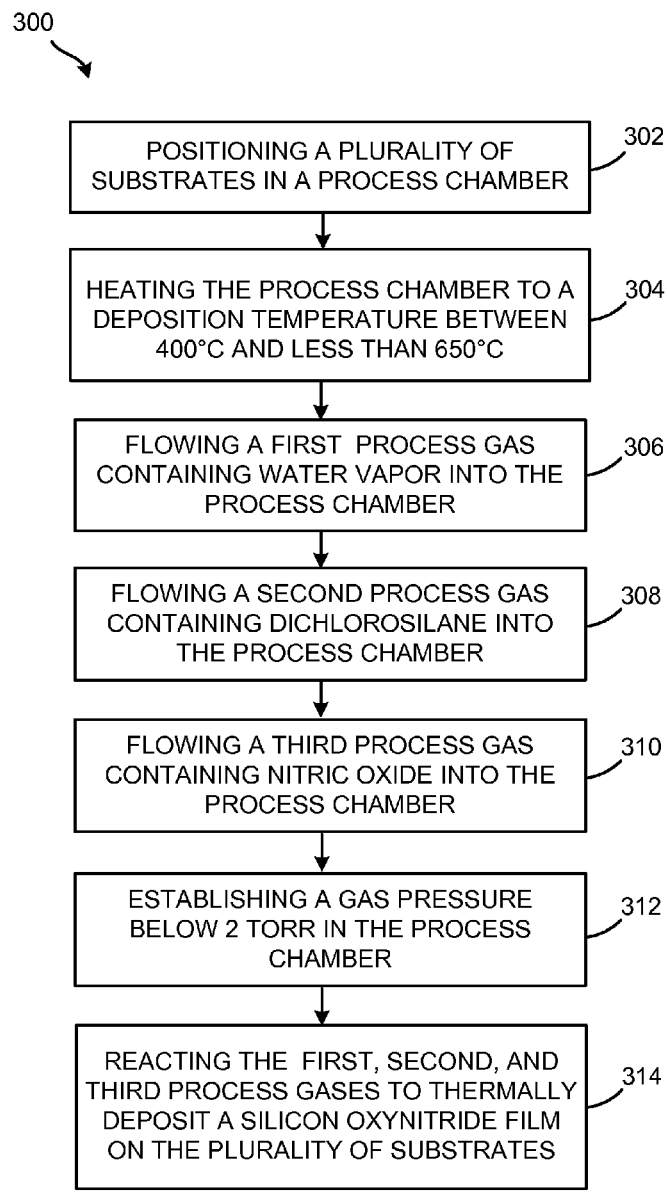
FIG. 3 shows a process flow diagram of one embodiment of the method of depositing an oxynitride film on a substrate

Referring now to both FIGS. 1 and 3, in another embodiment of the method 300, in 302, the plurality of substrates 20 are positioned in the process chamber 12. The substrates 20 may be positioned on a rotatable substrate holder 13. As one skilled in the art will observe, positioning or loading the substrates 20 within the batch processing system 10 may include exhausting the process chamber 12 through the exhaust port 15 and evacuating the process chamber 12 through a vacuum port 14 following insertion of the substrates 20. In addition, positioning the substrates 20 within the batch processing system 10 may also include purging the process chamber 12 with inert gas, such as nitrogen, to dilute or reduce the concentration of organic contaminants within the process chamber 12.

In 304, the process chamber 12 is then heated to a processing temperature between 400° C. and less than 650° C. During heating of the process chamber 12, a heating rate may be from a few degrees C. per minute to 100 or more degrees C. per minute.

Following heating, in 306, a first process gas containing water vapor is introduced into the process chamber 12 through an inlet port 16. In 308, a second process gas containing DCS and optionally a dilution gas is introduced into the process chamber 12 through an inlet port 17. In 310, a third process gas containing NO and optionally a dilution gas is introduced into the process chamber. In 312, a process gas pressure below 2 Torr is established in the process chamber. In 314, oxygen from the water vapor reacts with the DCS in the gas phase and the NO reacts such that nitrogen from the NO is incorporated into the silicon oxide film, thereby forming a silicon oxynitride film on each of the substrates 20.

In conjunction with the flow of the first, second and optionally the third process gases, which create the processing ambients, the processing ambients have a processing pressure. The inventors have realized that the processing pressure may be below 2 Torr in order to deposit silicon oxide and silicon oxynitride films with good uniformity and the required material and electronic properties for semiconductor devices. According to one embodiment, the processing pressure can between 100 mTorr and less than 2 Torr, between 100 mTorr and 1 Torr, between 1 Torr and less than 2 Torr, between 1 Torr and 1.5 Torr, or between 1.5 Torr and less than 2 Torr. According to embodiments of the invention, the deposition processes can utilize a deposition temperature between 400° C. and less than 650° C., between 400° C. and 450° C., between 400° C. and 500° C., between 500° C. and 550° C., between 500° C. and 600° C., between 550° C. and 600° C., between 550° C. and less than 650° C., or between 600° C. and less than 650° C. In one embodiment, the processing pressure is set in conjunction with the processing temperature to control a deposition rate of the silicon oxide or silicon oxynitride film. One skilled in the art will observe that the processing pressure and the flow rates of the gases may change at any time during the film deposition. Therefore, the term "set" is not limited to a single act of setting the processing pressure, flow rates of gases, or processing temperature. Rather, set may refer to any number of settings or adjustments such that depositing a silicon oxide film or a silicon oxynitride film is in accordance with any quality standards either from internal controls, from industry, or determined by the customer. The flow rates of the first, second, and optional third process gas may range from 10 sccm (standard cubic centimeters per minute) to 20 slm (standard liters per minute), 1 to 5000 sccm for the NO nitriding gas, and 100 sccm to 20 slm for the diluting gas.

According to one embodiment of the invention, prior to flowing the first process gas containing water vapor into the process chamber 12, the water vapor is generated external to the process chamber 12, as shown in FIG. 1, by combustion of a hydrogen gas ($H_2$) and an oxygen gas ($O_2$). One example of generating the first wet process gas is with a high-dilution pyrogenic torch 18, as depicted in FIG. 1, developed by Tokyo Electron Ltd., Nirasaki, Yamanashi, Japan. The high-dilution pyrogenic torch 18 combusts small flows of hydrogen gas and oxygen gas. The pyrogenic torch 18 thus generates the water vapor, i.e., water vapor in the form of steam, external to the process chamber 12.

In another embodiment of the invention, a diluting gas is used to dilute the first and second process gases in the processing ambient. The ratio of the concentration of the diluting gas to the concentration of the first and second process gases may influence the deposition rate of the silicon oxide or silicon oxynitride films. Therefore, the diluting gas may be used to control the silicon oxide film growth rate and the silicon oxynitride film growth rate. In one embodiment, the diluting gas comprises nitrogen ($N_2$), as shown in FIG. 1. However, other non-reactive gases may be used, for example, argon (Ar). Still referring to FIG. 1, those skilled in the art will readily realize that a nitrogen diluting gas may be used to dilute the first process gas containing water vapor without flowing NO gas into the process chamber.

In another embodiment of the method, once the silicon oxide film or silicon oxynitride film is deposited on each of the substrates 20, the substrates 20 having the film thereon are heat-treated at a heat-treating temperature that is higher than the deposition temperature. As is known in the art, heat-treating a silicon dioxide or silicon oxynitride film on the substrates 20 may modify the properties of the film, particularly the film's electrical properties and thus the electrical properties of a device containing the film. According to embodiments of the invention, during the heat-treating, the processing ambient and the processing pressure, may be modified. For example, following the film deposition in the process chamber 12, the process chamber 12 may be vacuum purged one or more times to remove the processing ambient containing the first, second, and optional third process gas and the diluting gas, if any, prior to heat-treating. Once purged of the processing ambient, a heat-treating gas may be introduced and a heat-treating temperature and a heat-treating pressure may be established within the process chamber 12, which may require raising or lowering the pressure from the deposition pressure. Alternatively, the substrates 20 having the silicon oxide or silicon oxynitride film thereon may be transferred to a different treatment system for heat-treating. The heat-treating pressure may have similar ranges as the deposition pressure. According to one embodiment, the heat-treating gas comprises at least one of nitrogen ($N_2$), nitric oxide (NO), nitrous oxide ($N_2O$), oxygen ($O_2$), or water ($H_2O$), or combinations thereof.

Figure 4:
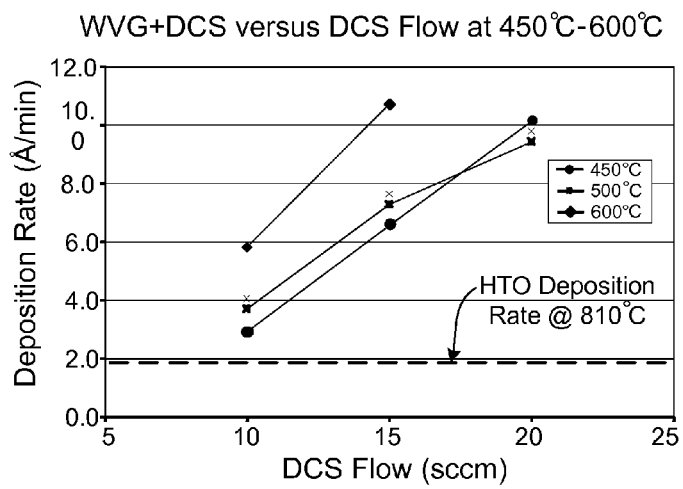
FIG. 4 shows silicon oxide deposition rate as a function of DCS flow according to embodiments of the invention.

FIG. 4 shows silicon oxide deposition rate as a function of DCS flow according to embodiments of the invention. The film deposition conditions included a $H_2$ gas flow of 100 sccm and an $O_2$ gas flow rate of 100 sccm through the pyrogenic torch 18, a water vapor generator, thus generating the water vapor. A $N_2$ dilution gas flow rate of 200 sccm was used to dilute the first process gas containing the water vapor. A processing pressure of 0.2 Torr was established during deposition of the silicon oxide films and the deposition temperature was varied from 450° C. to 600° C. The silicon oxide film thicknesses were less than about 100 Å. The DCS gas flow rate was varied from 10 sccm to 20 sccm. FIG. 4 shows that increasing the DCS flow rate resulted in increased silicon oxide deposition rates from about 3-4 Å/min to about 9-10 Å/min at deposition temperatures of 450° C. and 500° C., and from 6 Å/min to about 11 Å/min at 600° C. Furthermore, for comparison, FIG. 4 shows that the deposition rate of silicon oxide films is only about 2 Å/min at a deposition temperature of 810° C. using the conventional HTO process of reacting DCS with $N_2O$ on the substrate surface and the deposition rate is substantially independent of the DCS flow rate.

Figure 5:
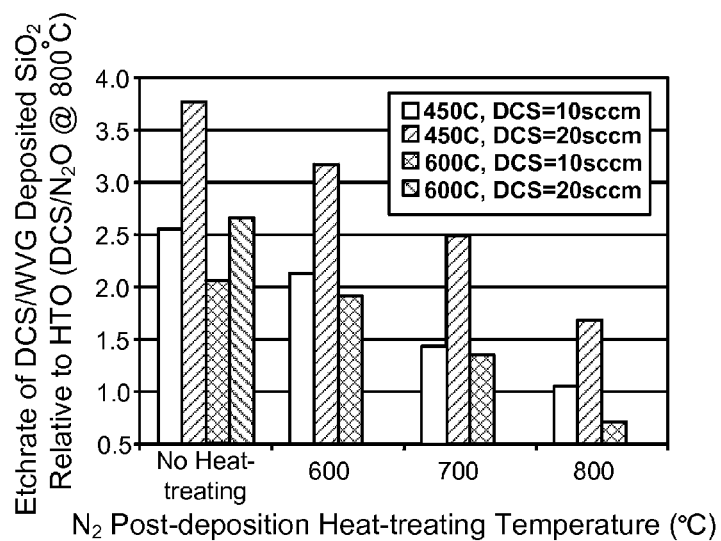
FIG. 5 shows wet etch rates of different silicon oxide films as a function of $N_2$ post-deposition heat-treating temperature according to embodiments of the invention.

FIG. 5 shows wet etch rates of different silicon oxide films as a function of $N_2$ post-deposition heat-treating temperature according to embodiments of the invention. Wet etch rates are a measure of a material quality of the silicon oxide films, where high quality silicon oxide films wet etch slower than low quality silicon oxide films. The deposited silicon oxide films were subsequently heat-treated for 1 hour in the (deposition) process chamber at different temperatures in the presence of $N_2$ gas at a processing pressure of 0.5 Torr. Following the heat-treating, the silicon dioxide films were subjected to a wet etching process for 2.5 minutes in dilute HF (200:1, $H_2O$:HF) and the etch rate normalized to the etch rate of baseline HTO silicon oxide films deposited at 800° C. using a DCS gas flow rate of 50 sccm and a $N_2O$ gas flow rate of 100 sccm. FIG. 5 shows that for as-deposited silicon oxide films, higher deposition temperature or higher DCS gas flows resulted in higher wet etch rates. Further, the higher the post-deposition heat-treating temperature, the lower the wet etch rates for silicon oxide films deposited using DCS gas flow rates of 10 sccm. In one example, the wet etch rate of a silicon oxide film deposited using a low DCS gas flow rate (10 sccm) at a substrate temperature of 600° C. and subsequently heat-treated at a substrate temperature of 800° C. in $N_2$ gas was less than that for the base line HTO silicon oxide films.

Figures 6, 7:
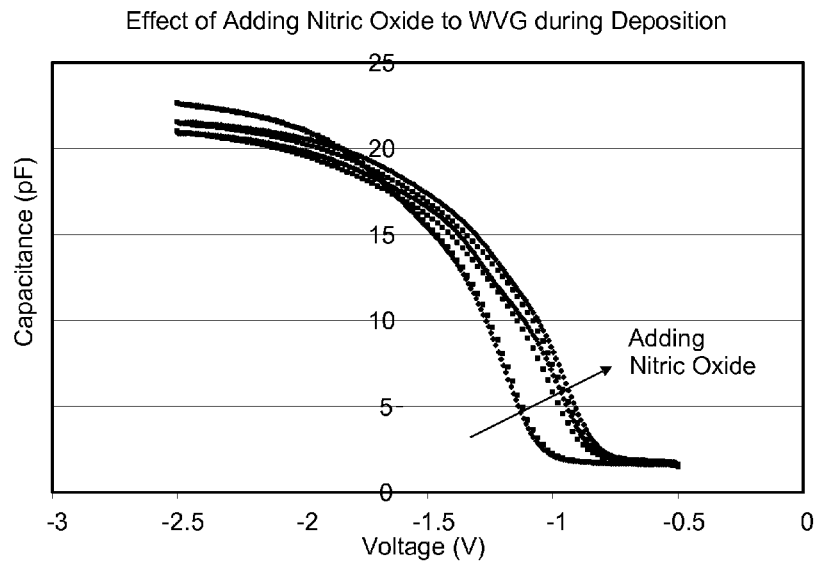
FIG. 6 shows capacitance-voltage curves for silicon oxide and silicon oxynitride films formed by embodiments of the invention and FIG. 7 shows a table of properties of the silicon oxide and silicon oxynitride films.

FIG. 6 shows capacitance-voltage curves for silicon oxide and silicon oxynitride films formed by embodiments of the invention and FIG. 7 shows a table with properties of the silicon oxide and silicon oxynitride films. The silicon oxide films were deposited using DCS and water vapor and the silicon oxynitride films were depositing by adding 50 sccm and 100 sccm of NO gas to the DCS and water vapor process gases. The results in FIG. 6 and FIG. 7 illustrate that the addition of the NO gas increases the $T_{ox}$, the deposition rate, the equivalent oxide thickness (EOT), and the dielectric constant (K). Although not shown in FIG. 7, for a NO gas flow between 0 and 50 sccm, it is expected that interface trap density ($D_{it}$) may be reduced by a factor of approximately 100 from that of a baseline silicon oxide, i.e., lowered from approximately E12 $eV^{-1}cm^{-2}$ to approximately E10 $eV^{-1}cm^{-2}$. Such a $D_{it}$ reduction would provide a silicon oxynitride film with an interface that is relatively free of charge traps and as such may be advantageously used as a gate dielectric for metal oxide semiconductor field effect transistor (MOSFET) devices with great improvements in electron/hole mobility and peak channel drive currents. Further, as the NO gas flow rate is increased to greater than 50 sccm and N concentration in the silicon oxynitride film is further increased, it is expected that reliability of semiconductor devices containing the silicon oxynitride film (e.g., non-volatile memory (NVM) applications such as flash tunnel gates) will be improved, despite the increase in the $D_{it}$ value. While increased $D_{it}$ values indicate increasing potential for interface charge trapping and possible shift in MOSFET threshold voltage ($V_{th}$), the improvements in reliability for NVM applications are thought to greatly outweigh any disadvantages from $D_{it}$ increases. The increased N concentration is thought to be helpful in binding more tightly loose (dangling) atomic bonds within the film. Further, the increased N concentration increases the density of the film and results in increased resistance to electron bombardment at elevated voltages that are often used during semiconductor processing. Overall, the results show that, unlike when using prior art reactions of DCS and $N_2O$, adding NO during film deposition using DCS and $H_2O$, is effective for incorporating N into silicon oxide films to form silicon oxynitride films for semiconductor devices.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention is therefore not limited to the specific details, representative apparatus and method and illustrative examples shown and described. Accordingly, departures may be made from such details without departing from the scope of the general inventive concept.

What is claimed is:

1. A method for forming a dielectric film on a substrate, the method comprising:
   positioning a plurality of substrates in a process chamber;
   heating the process chamber to a deposition temperature between 400° C. and less than 650° C.;
   flowing a first process gas comprising water vapor into the process chamber;
   flowing a second process gas comprising dichlorosilane (DCS) into the process chamber;
   establishing a gas pressure below 2 Torr in the process chamber; and
   reacting the first and second process gases to thermally deposit a silicon oxide film on the plurality of substrates by non-plasma chemical vapor deposition.

2. The method of claim 1, further comprising generating the water vapor external to the process chamber by combusting a hydrogen ($H_2$) gas and an oxygen ($O_2$) gas.

3. The method of claim 1, further comprising,
   after forming the silicon oxide film, heat-treating the substrate having the silicon oxide film thereon in a heat-treating gas comprising at least one of nitrogen ($N_2$), nitric oxide (NO), nitrous oxide ($N_2O$), oxygen ($O_2$), or water ($H_2O$), or combinations thereof.

4. The method of claim 3, wherein the heat-treating is performed at a temperature that is greater than the deposition temperature.

5. The method of claim 1, further comprising
   flowing a first diluting gas into the process chamber while flowing the first process gas and the second process gas to control a growth rate of the silicon oxide film.

6. The method of claim 1, further comprising
   flowing a third process gas comprising nitric oxide (NO) gas into the process chamber while flowing the first process gas and the second process gas; and
   reacting the silicon oxide film with the third process gas to form a silicon oxynitride film on the substrate.

7. The method of claim 6, wherein the third process gas comprising NO gas is added to the first process gas external to the process chamber.

8. The method of claim 6, further comprising
   flowing a first diluting gas into the process chamber while flowing the first process gas and the second process gas to control a growth rate of the silicon oxide film; and
   flowing a second diluting gas into the process chamber while flowing the third process gas to control nitrogen incorporation into the silicon oxide film.

9. The method of claim 6, further comprising,
   after forming the silicon oxynitride film, heat-treating the substrate having the silicon oxynitride film thereon in an heat-treating gas comprising at least one of nitrogen ($N_2$), nitric oxide (NO), nitrous oxide ($N_2O$), oxygen ($O_2$), or water ($H_2O$), or combinations thereof.

10. The method of claim 9, wherein the heat-treating is performed at a temperature that is greater than the deposition temperature.

11. The method of claim 6, wherein the silicon oxynitride films has lower interface trap density (Dit) than the silicon oxide film.

12. A method for forming a dielectric film on a substrate, the method comprising:
    positioning a plurality of substrates in a process chamber;
    heating the process chamber to a deposition temperature between 400° C. and less than 650° C.;
    flowing a first process gas comprising water vapor into the process chamber, wherein the water vapor is generated external to the process chamber by combusting a hydrogen ($H_2$) gas and an oxygen ($O_2$) gas;
    flowing a second process gas comprising dichlorosilane (DCS) into the process chamber;
    establishing a gas pressure of less than 2 Torr in the process chamber;
    reacting the first and second process gases to thermally deposit a silicon oxide film on the plurality of substrates by non-plasma chemical vapor deposition; and
    after forming the silicon oxide film, heat-treating the substrate having the silicon oxide film thereon in a heat-treating gas comprising at least one of nitrogen ($N_2$), nitric oxide (NO), nitrous oxide ($N_2O$), oxygen ($O_2$), or water ($H_2O$), or combinations thereof, wherein the heat-treating is performed at a temperature that is greater than the deposition temperature.

13. The method of claim 12, further comprising
    flowing a first diluting gas into the process chamber while flowing the first process gas and the second process gas to control a growth rate of the silicon oxide film.

14. A method for forming a dielectric film on a substrate, the method comprising:
    positioning a plurality of substrates in a process chamber;
    heating the process chamber to a deposition temperature between 400° C. and less than 650° C.;
    flowing a first process gas comprising water vapor into the process chamber;
    flowing a second process gas comprising dichlorosilane (DCS) into the process chamber;
    flowing a third process gas comprising nitric oxide (NO) into the process chamber establishing a gas pressure of less than 2 Torr in the process chamber;
    reacting the first, second, and third process gases to thermally deposit a silicon oxynitride film on the plurality of substrates; and
    after forming the silicon oxynitride film, heat-treating the substrate having the silicon oxynitride film thereon in an heat-treating gas comprising at least one of nitrogen ($N_2$), nitric oxide (NO), nitrous oxide ($N_2O$), oxygen ($O_2$), or water ($H_2O$), or combinations thereof.

15. The method of claim 14, wherein the heat-treating is performed at a temperature that is greater than the deposition temperature.

16. The method of claim 14, further comprising generating the water vapor external to the process chamber by combusting a hydrogen ($H_2$) gas and an oxygen ($O_2$) gas.

17. The method of claim 14, further comprising
    flowing a first diluting gas into the process chamber while flowing the first process gas and the second process gas to control a growth rate of the silicon oxide film; and
    flowing a second diluting gas into the process chamber while flowing the third process gas to control to control nitrogen incorporation into the silicon oxide film.

18. The method of claim 14, wherein the third process gas comprising NO gas is added to the first process gas external to the process chamber.

* * * * *

UNITED STATES PATENT AND TRADEMARK OFFICE
CERTIFICATE OF CORRECTION

| | |
|---|---|
| PATENT NO. | : 7,994,070 B1 |
| APPLICATION NO. | : 12/894513 |
| DATED | : August 9, 2011 |
| INVENTOR(S) | : Anthony Dip et al. |

It is certified that error appears in the above-identified patent and that said Letters Patent is hereby corrected as shown below:

In The Claims

Column 8, line 61, "silicon oxide film" should be --silicon oxynitride film--

Column 8, line 64, "silicon oxide film" should be --silicon oxynitride film--

Signed and Sealed this
Twelfth Day of April, 2016

Michelle K. Lee
*Director of the United States Patent and Trademark Office*